United States Patent
Liu et al.

(10) Patent No.: US 9,344,048 B1
(45) Date of Patent: May 17, 2016

(54) OPERATIONAL AMPLIFIER AND METHOD OF AMPLIFYING WITH THE OPERATIONAL AMPLIFIER

(71) Applicant: Beken Corporation, Shanghai (CN)

(72) Inventors: Jiazhou Liu, Shanghai (CN); Dawei Guo, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 0 days.

(21) Appl. No.: 14/634,890

(22) Filed: Mar. 1, 2015

(30) Foreign Application Priority Data

Jan. 30, 2015 (CN) .......................... 2015 1 0051993

(51) Int. Cl.
*H03F 3/45* (2006.01)

(52) U.S. Cl.
CPC ...... *H03F 3/45645* (2013.01); *H03F 2200/153* (2013.01)

(58) Field of Classification Search
CPC ......................................................... H03F 3/45
USPC .......................................... 330/258, 260, 253
See application file for complete search history.

(56) References Cited

U.S. PATENT DOCUMENTS

| 4,543,538 | A | * | 9/1985 | Fay | H03F 3/45085 330/252 |
|---|---|---|---|---|---|
| 5,844,442 | A | * | 12/1998 | Brehmer | H03F 3/45179 330/258 |
| 6,133,719 | A | * | 10/2000 | Maulik | G05F 3/30 323/313 |
| 6,215,816 | B1 | * | 4/2001 | Gillespie | H04L 12/44 370/402 |
| 6,426,676 | B1 | * | 7/2002 | Kuijk | H03F 3/45076 330/252 |
| 2013/0266156 | A1 | * | 10/2013 | Frohlich | H03F 1/34 381/120 |

* cited by examiner

*Primary Examiner* — Patricia T Nguyen
(74) *Attorney, Agent, or Firm* — Perkins Coie LLP

(57) ABSTRACT

An operational amplifier comprises an input pair, an aiding unit, an even number of amplification stages, a feeding unit, a first current source, a second current source. Both the input pair and the aiding unit are connected to the first current source. The input pair receives differential input voltage. Both the input pair and the aiding unit are further connected to a first stage of the even number of amplification stages. The even number of amplification stages are connected in series, and the last stage of the amplification stages outputs differential output voltages. The feeding unit is configured to receive a common mode voltage of the differential output voltages, and feeds a voltage on a first node of the feeding unit back to the aiding unit so as to provide bias voltage to the aiding unit. The aiding unit avoids dead lock of the input pair.

22 Claims, 8 Drawing Sheets

OPERATIONAL AMPLIFIER AND METHOD OF AMPLIFYING WITH THE OPERATIONAL AMPLIFIER

CROSS REFERENCE TO RELATED APPLICATION

This application claims priority to Chinese Application No. 201510051993. X entitled "Operational amplifier and method in the operational amplifier," filed on Jan. 30, 2015 by Beken Corporation, which is incorporated herein by reference.

TECHNICAL FIELD

The present application relates to circuits, and more particularly but not exclusively to an operational amplifier and a method of amplifying with the operational amplifier.

BACKGROUND

Conventional operational amplifiers use an assistant voltage to feed to differential voltage input pair. However, such assisting voltage is hard to obtain in real application. Therefore, it is desirable to have an operational amplifier with appropriate assisting voltage.

SUMMARY OF THE INVENTION

In an embodiment, an operational amplifier comprises an input pair, an aiding unit, an even number of amplification stages, a feeding unit, a first current source, a second current source; wherein both the input pair and the aiding unit are connected to the first current source, the input pair is also configured to receive differential input voltage, and both the input pair and the aiding unit are further connected to a first stage of the even number of amplification stages; the even number of amplification stages are connected in series, and a last stage of the amplification stages is configured to output differential output voltages; the feeding unit is configured to receive a common mode voltage of the differential output voltages from the last stage, and is configured to feed a voltage on a first node of the feeding unit back to the aiding unit so as to provide bias voltage to the aiding unit, wherein the aiding unit is configured to avoid dead lock of the input pair.

Another embodiment discloses a method in an operational amplifier, wherein the operational amplifier comprises an input pair, an aiding unit, an even number of amplification stages, a feeding unit, a first current source, a second current source; wherein first nodes of both the input pair and the aiding unit are connected to the first current source, and third nodes of both the input pair and the aiding unit are connected to a first stage of the even number of amplification stages; the even number of amplification stages are connected in series; the feeding unit is configured to receive a common mode voltage of the differential output voltages from the last stage; where the method comprises receiving, by the input pair, differential input voltage; amplifying the differential input voltage by the even number of amplification stages; outputting, by a last stage of the amplification stages, differential output voltages; feeding, by the feeding unit, a voltage on a first node of the feeding unit back to the aiding unit so as to provide bias voltage to the aiding unit, wherein the aiding unit is configured to avoid dead lock of the input pair.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 1:
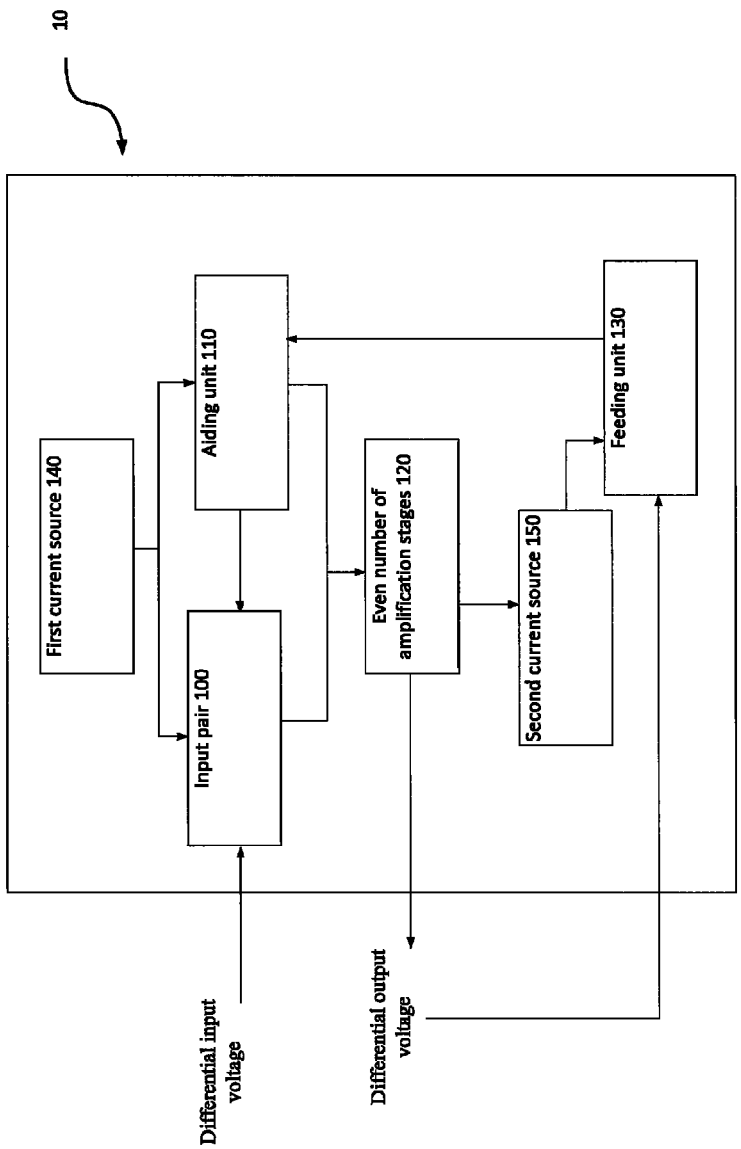
FIG. 1 is a diagram illustrating an embodiment of an operational amplifier.

FIG. 1 is a diagram illustrating an embodiment of an operational amplifier 10. The operational amplifier 10 comprises an input pair 100, an aiding unit 110, an even number of amplification stages 120, a feeding unit 130, a first current source 140 and a second current source 150. Both the input pair 100 and the aiding unit 110 are connected to the first current source 140. The input pair 100 is also configured to receive differential input voltage. Both the input pair 100 and the aiding unit 110 are further connected to a first stage of the even number of amplification stages 120. Note that the operational amplifier includes multiple amplification stages, the number of multiple amplification stages is even. The even number of amplification stages 120 are connected in series, and a last stage of the amplification stages 120 is configured to output differential output voltages. The amplification stages are connected in series means an input of next amplification stage is connected to an output of previous amplification stage. The feeding unit 130 is configured to receive a common mode voltage of the differential output voltages from the last stage of the even number of amplification stages 120. The feeding unit 130 is configured to feed a voltage on a first node of the feeding unit 130 back to the aiding unit 110 so as to provide bias voltage to the aiding unit 110, wherein the aiding unit 110 is configured to avoid dead lock of the input pair 100.

Figure 2:
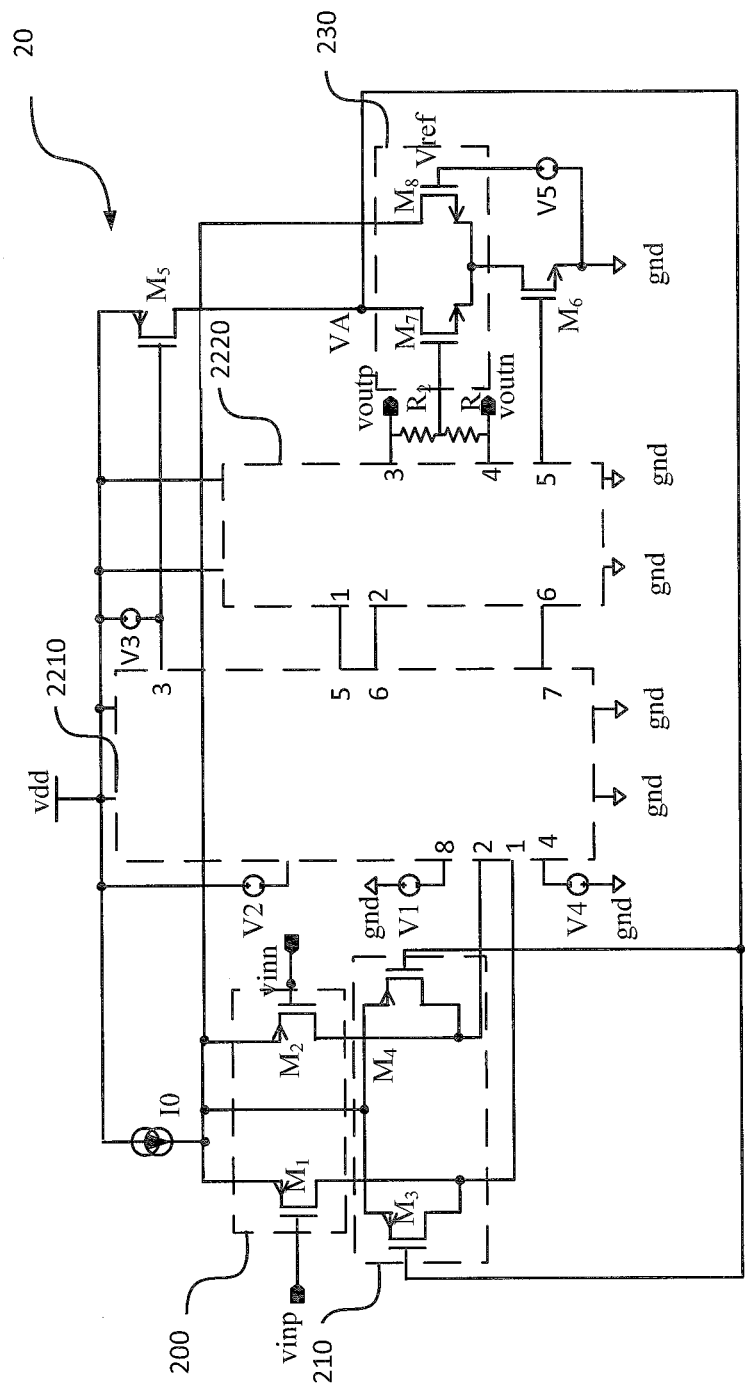
FIG. 2 is a diagram illustrating another embodiment of an operational amplifier.

FIG. 2 is a diagram illustrating another embodiment of an operational amplifier 20. As shown in FIG. 2, the common mode voltage of the differential output voltages comprises a median voltage potential between the differential output voltages voutp and voutn, that is the connecting point of the resistor R1 and the resistor R2. The resistance of R1 equals the resistance of R2. The input pair 200 shown in the dashed block comprises a first MOS transistor $M_1$ and a second MOS transistor $M_2$. The aiding unit 210 shown in the dashed block comprises a third MOS transistor $M_3$ and a fourth MOS transistor $M_4$. The second current source comprises a fifth MOS transistor $M_5$. The feeding unit 230 comprises a seventh MOS transistor $M_7$ and an eight MOS transistor $M_8$. The even number of amplification stages 220 comprises a first amplification stage 2210 and a second amplification stage 2220. The first amplification stage 2210 may also comprise the input pair 200. The operational amplifier further comprises a sixth MOS transistor $M_6$.

First nodes of both the first MOS transistor $M_1$ and the second MOS transistor $M_2$ are connected to the first current source I0. Second node of the first MOS transistor $M_1$ is configured to receive a positive input voltage vinp, and a second node of the second MOS transistor $M_2$ is configured to receive a negative input voltage vinn. A third node of the first MOS transistor $M_1$ is connected to a third node of the third MOS transistor $M_3$. A third node of the second MOS transistor M2 is connected to a third node of the fourth MOS transistor $M_4$.

First nodes of both the third MOS transistor $M_3$ and the fourth MOS transistor $M_4$ are connected to the first current source I0, just as the first nodes of both the first MOS transistor $M_1$ and second MOS transistor $M_2$. Second nodes of both the third MOS transistor $M_3$ and the fourth MOS transistor $M_4$ are connected to a third node of the seventh MOS transistor $M_7$. The third node of the third MOS transistor $M_3$ is also connected to a first port of the first amplification stage 2210. The third node of the fourth MOS transistor $M_4$ is also connected to a second port of the first amplification stage 2210.

A first node of the fifth MOS transistor $M_5$ is connected to a first power supply. A second node of the fifth MOS transistor $M_5$ is connected to a third port of the first amplification stage 2210. A third node of the fifth MOS transistor $M_5$ is connected to a third node of the seventh MOS transistor $M_7$.

A first node of the seventh MOS transistor $M_7$ is connected to both a first node of the eighth MOS transistor $M_8$ and a third node of the sixth MOS transistor $M_6$. A second node of the seventh MOS transistor $M_7$ is connected to a connection point of the first resistor $R_1$ and the second resistor $R_2$. A second node of the eighth MOS transistor $M_8$ is connected to a fifth voltage source V5. The fifth voltage source V5 may be connected to ground. A third node of the eighth MOS transistor $M_8$ is connected to the first nodes of the first and the second MOS transistors $M_1$ and $M_2$.

A third port of the first amplification stage 2210 is connected to a third voltage source V3, and the third voltage source V3 is connected to the first power supply. Fourth port of the first amplification stage 2210 is connected to a fourth voltage source V4, and the fourth voltage source V4 is connected to ground. A fifth port of the first amplification stage 2210 is connected to a first port of the second amplification stage 2220. A sixth port of the first amplification stage 2210 is connected to a second port of the second amplification stage 2220. A seventh port of the first amplification stage is connected to a sixth port of the first amplification stage. An eighth port of the first amplification stage is connected to a first voltage source V1, a third port of the second amplification stage is configured to output a positive output voltage, a third a fourth port of the second amplification stage is configured to output a negative output voltage, wherein a first resistor and a second resistor are connected in serial between a positive output voltage port and a negative output voltage port. Vref is the reference voltage, which can be provided by the fifth voltage source V5. VA is the voltage of the drain of the fifth MOS transistor $M_5$.

Figure 3:
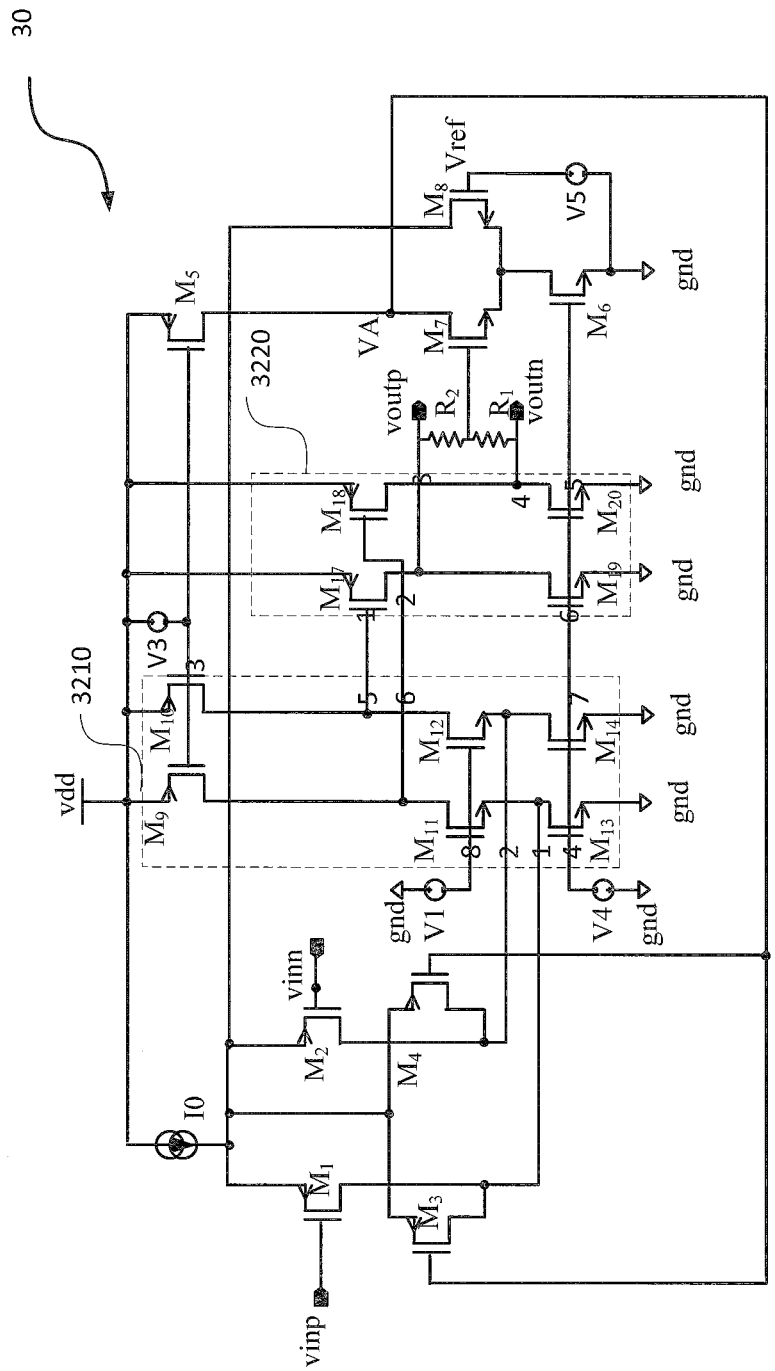
FIG. 3 is a diagram illustrating a specific implementation of the operational amplifier shown in FIG. 2.

FIG. 3 is a diagram illustrating a specific implementation of the operational amplifier shown in FIG. 2. As shown in FIG. 3, the first amplification stage 3210 comprises a ninth MOS transistor $M_9$, a tenth MOS transistor $M_{10}$, an eleventh MOS transistor $M_{11}$, a twelfth MOS transistor $M_{12}$, a thirteenth MOS transistor $M_{13}$, a fourteenth MOS transistor $M_{14}$. The first port of the first amplification stage 3210 comprises a first node of the eleventh MOS transistor $M_{11}$. The second port of the first amplification stage 3210 comprises a first node of the twelfth MOS transistor $M_{12}$. The third port of the first amplification stage 3210 comprises a second node of the tenth MOS transistor $M_{10}$. The fourth port of the first amplification stage 3210 comprises a second node of the thirteenth MOS transistor $M_{13}$. The fifth port of the first amplification stage 3210 comprises a third node of the twelfth MOS transistor $M_{12}$. The sixth port of the first amplification stage 3210 comprises a third node of the eleventh MOS transistor $M_{11}$. The seventh port of the first amplification stage 3210 comprises a second node of the fourteenth MOS transistor $M_{14}$. The eighth port of the first amplification stage comprises a second node of the eleventh MOS transistor $M_{11}$.

First nodes of both the ninth and tenth MOS transistors $M_9$ and $M_{10}$ are connected to the first power supply. Second nodes of both the ninth and tenth MOS transistors $M_9$ and $M_{10}$ are connected to both a third voltage source V3 and the second node of the fifth MOS transistor $M_5$. A third node of the ninth MOS transistor $M_9$ is connected to a third node of the eleventh MOS transistor $M_{11}$. A third node of the tenth MOS transistor $M_{10}$ is connected to a third node of the twelfth MOS transistor $M_{12}$.

A first node of the eleventh MOS transistor $M_{11}$ is connected to a third node of the thirteenth MOS transistor $M_{13}$. A first node of the twelfth MOS transistor $M_{12}$ is connected to a third node of the fourteenth MOS transistor $M_{14}$. Second nodes of both the eleventh and twelfth MOS transistors $M_{11}$ and $M_{12}$ are connected to the first voltage source.

Both first nodes of the thirteenth MOS transistor $M_{13}$ and the fourteenth MOS transistor $M_{14}$ are connected to a second power supply. Both second nodes of the thirteenth MOS transistor $M_{13}$ and the fourteenth MOS transistor $M_{14}$ are connected to the fourth voltage source V4.

The second amplification stage 3220 comprises a seventeenth MOS transistor $M_{17}$, an eighteenth MOS transistor $M_{18}$, a nineteenth MOS transistor $M_{19}$, and a twentieth MOS transistor $M_{20}$.

The first port of the second amplification stage 3220 comprises a second node of the seventeenth MOS transistor $M_{17}$. The second port of the second amplification stage 3220 comprises a second node of the eighteenth MOS transistor $M_{18}$. The third port of the second amplification stage 3220 comprises a third node of the seventeenth MOS transistor $M_{17}$. The fourth port of the second amplification stage 3220 comprises a third node of the eighteenth MOS transistor $M_{18}$. The fifth port of the second amplification stage 3220 comprises a second node of the twentieth MOS transistor $M_{20}$. The sixth port of the second amplification stage 3220 comprises a second node of the nineteenth MOS transistor $M_{19}$.

First nodes of both the seventeenth and eighteenth MOS transistors $M_{17}$ and $M_{18}$ are connected to the first power supply. A second node of the seventeenth MOS transistor $M_{17}$ is connected to the third node of the twelfth MOS transistor $M_{12}$. A second node of the eighteenth MOS transistor $M_{18}$ is connected to the third node of the eleventh MOS transistor $M_{11}$. A third node of the seventeenth MOS transistor $M_{17}$ is connected to a third node of the nineteenth MOS transistor $M_{19}$. A third node of the eighteenth MOS transistor $M_{18}$ is connected to a third node of the twentieth MOS transistor $M_{20}$.

First nodes of both the nineteenth MOS transistor $M_{19}$ and the twentieth MOS transistor $M_{20}$ are connected to the second power supply. Second nodes of both the nineteenth and twentieth MOS transistors $M_{19}$ and $M_{20}$ are connected to the fourth voltage source.

Figure 4:
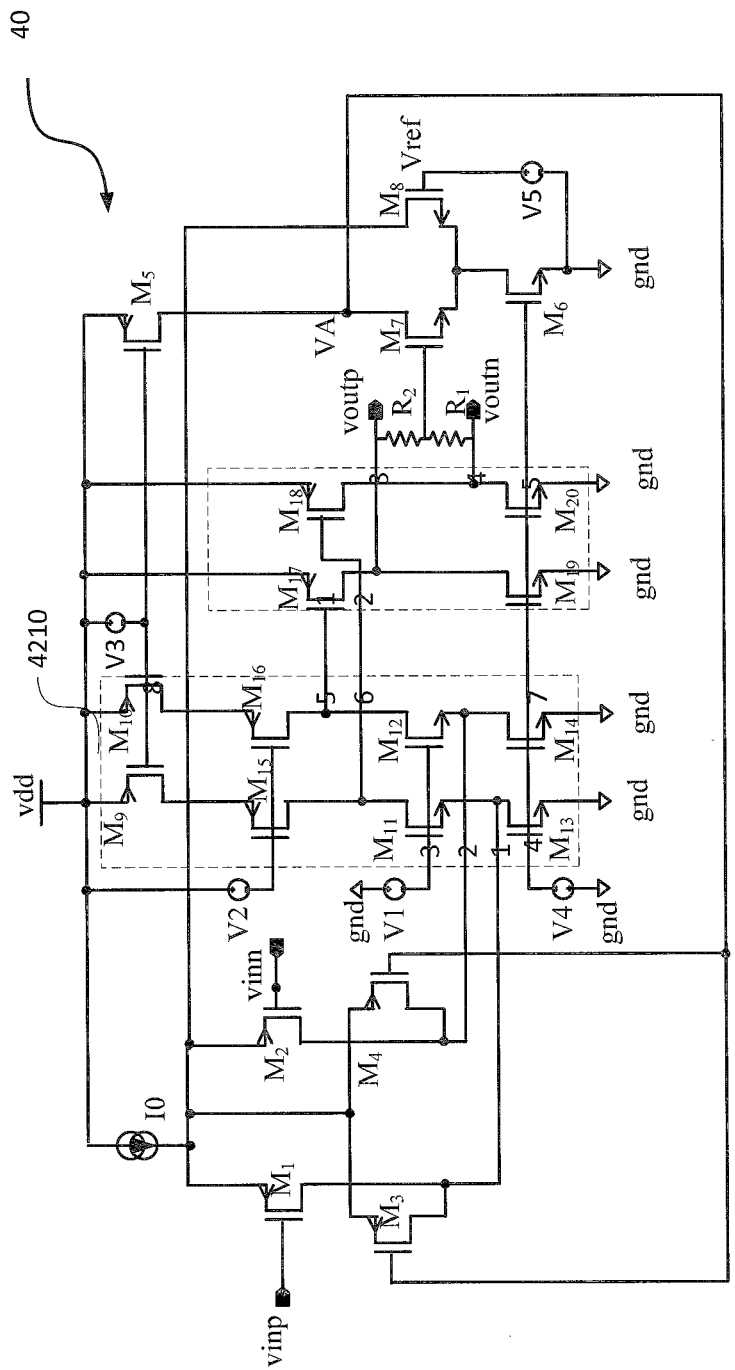
FIG. 4 is a diagram illustrating another specific implementation of the operational amplifier shown in FIG. 2.

FIG. 4 is a diagram illustrating another specific implementation of the operational amplifier shown in FIG. 2. FIG. 4 has many elements similar to that in FIG. 3. Therefore details are omitted for elements already described with respect to FIG. 3. As shown in FIG. 4, the first amplification stage 4210 further comprises a fifteenth MOS transistor $M_{15}$ and a sixteenth MOS transistor $M_{16}$. The ninth MOS transistor $M_9$ is connected to the eleventh MOS transistor $M_{11}$ via the fifteenth MOS transistor $M_{15}$. The tenth MOS transistor $M_{10}$ is connected to the twelfth MOS transistor $M_{12}$ via the sixteenth MOS transistor $M_{16}$. The fifteenth MOS transistor $M_{15}$ and the sixteenth MOS transistor $M_{16}$ are cascaded, so as to improve the output impendence, then the higher DC gain can be achieved.

First node of the fifteenth MOS transistor $M_{15}$ is connected to third node of the ninth MOS transistor $M_9$. First node of the sixteenth MOS transistor $M_{16}$ is connected to the third node of the tenth MOS transistor $M_{10}$. Second nodes of both the fifteenth MOS transistor $M_{15}$ and the sixteenth MOS transistor $M_{16}$ are connected to the second voltage source V2. A third node of the fifteenth MOS transistor $M_{15}$ is connected to the third node of the eleventh MOS transistor $M_{11}$. A third node of the sixteenth MOS transistor $M_{16}$ is connected to the third node of the twelfth MOS transistor $M_{12}$.

In the embodiments shown in FIG. 3 or FIG. 4, the first, the second, the third, the fourth MOS transistors $M_1$, $M_2$, $M_3$ and $M_4$, the fifth MOS transistor $M_5$, the ninth MOS transistor $M_9$, the tenth MOS transistor $M_{10}$, the seventeenth MOS transistor $M_{17}$ and the eighteenth MOS transistor $M_{18}$ include PMOS transistors. The sixth MOS transistor $M_6$, the seventh MOS transistor $M_7$, the eighth MOS transistor $M_8$, the eleventh MOS transistor $M_{11}$, the twelfth MOS transistor $M_{12}$, the thirteenth MOS transistor $M_{13}$, the fourteenth MOS transistor $M_{14}$, the nineteenth MOS transistor $M_{19}$ and the twentieth MOS transistor $M_{20}$ include NMOS transistors. The first power supply comprises a positive power supply (vdd) and the second power supply comprises ground (gnd).

The first node of each of these MOS transistors comprises a source, the second node of each of these MOS transistors comprises a gate, and the third node of each of these MOS transistors comprises a drain.

Referring again to FIG. 4, the fifteenth MOS transistor $M_{15}$ and the sixteenth MOS transistor $M_{16}$ comprise PMOS transistors. The first node of each of the fifteenth and sixteenth MOS transistors $M_{15}$, $M_{16}$ comprises a source, the second node of each of the fifteenth and sixteenth MOS transistors $M_{15}$ and $M_{16}$ comprises a gate. The third node of each of the fifteenth and sixteenth MOS transistors $M_{15}$ and $M_{16}$ comprises a drain.

Figure 5:
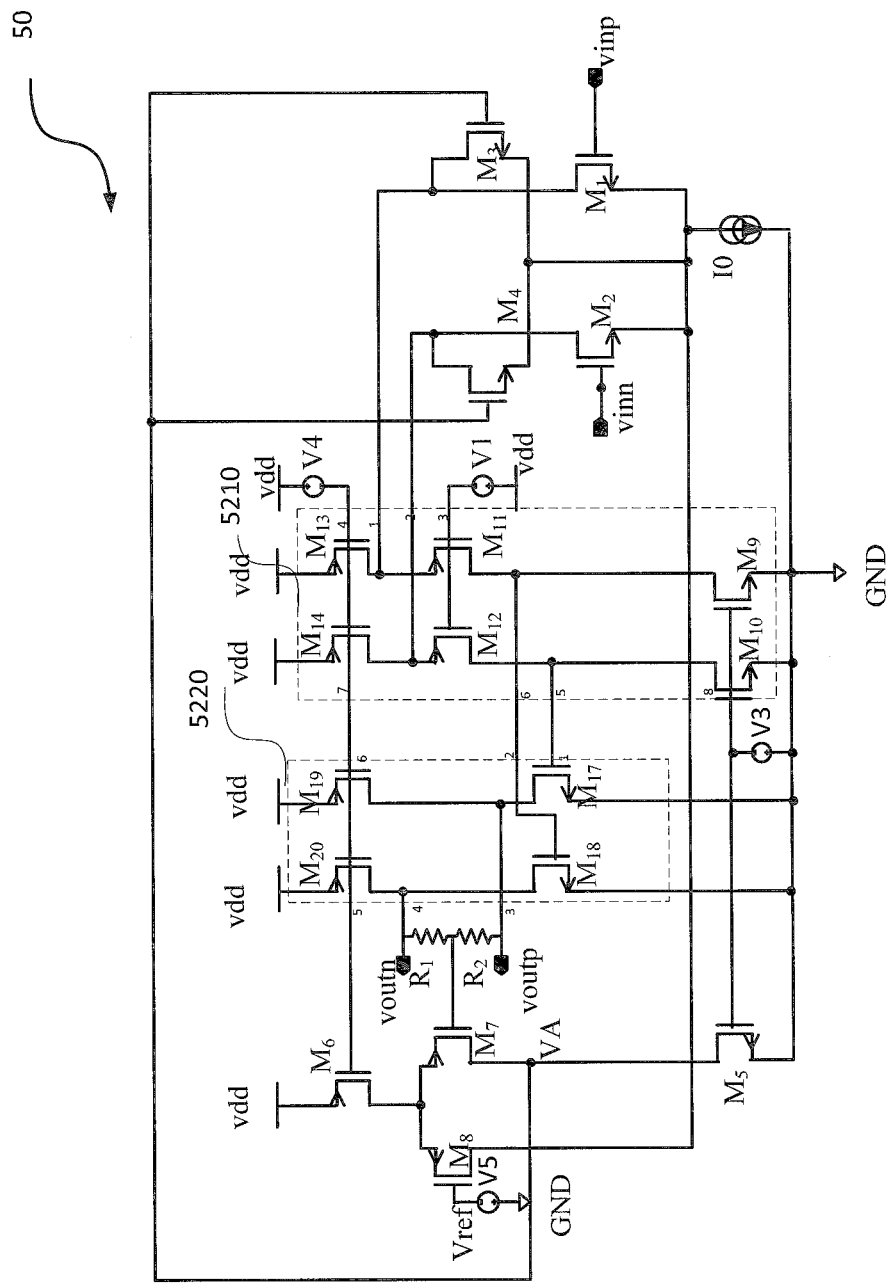
FIG. 5 is a diagram illustrating another specific implementation of the operational amplifier shown in FIG. 2.

FIG. 5 is a diagram illustrating another specific implementation of the operational amplifier shown in FIG. 2. The difference between FIG. 3 and FIG. 5 lies in that FIG. 5 uses inverted components with respect to FIG. 3. For example, the first MOS transistor $M_1$ in FIG. 3 is a PMOS transistor, while the first MOS transistor $M_1$ in FIG. 5 is a NMOS transistor instead.

Referring to FIG. 5, the first amplification stage 5210 and the second amplification stage 5220 include similar elements as the first amplification stage 3210 and the second amplification stage 3220 shown in FIG. 3. Therefore details are omitted for elements already described with respect to FIG. 5. The first, the second, the third, the fourth MOS transistors $M_1$, $M_2$, $M_3$ and $M_4$, the fifth MOS transistor $M_5$, the ninth MOS transistor $M_9$, the tenth MOS transistor $M_{10}$, the seventeenth MOS transistor $M_{17}$, the eighteenth MOS transistor $M_{18}$ include NMOS transistors. The sixth MOS transistor $M_6$, the seventh MOS transistor $M_7$, the eighth MOS transistor $M_8$, the eleventh MOS transistor $M_{11}$, the twelfth MOS transistor $M_{12}$, the thirteenth MOS transistor $M_{13}$, the fourteenth MOS transistor $M_{14}$, the nineteenth MOS transistor $M_{19}$ and the twentieth MOS transistor $M_{20}$ include PMOS transistors. The first power supply comprises ground supply (gnd) and the second power supply comprises a positive power (vdd).

The first node of each of these MOS transistors comprises a source. The second node of each of these MOS transistors comprises a gate. The third node of each of these MOS transistors comprises a drain.

Figure 6:
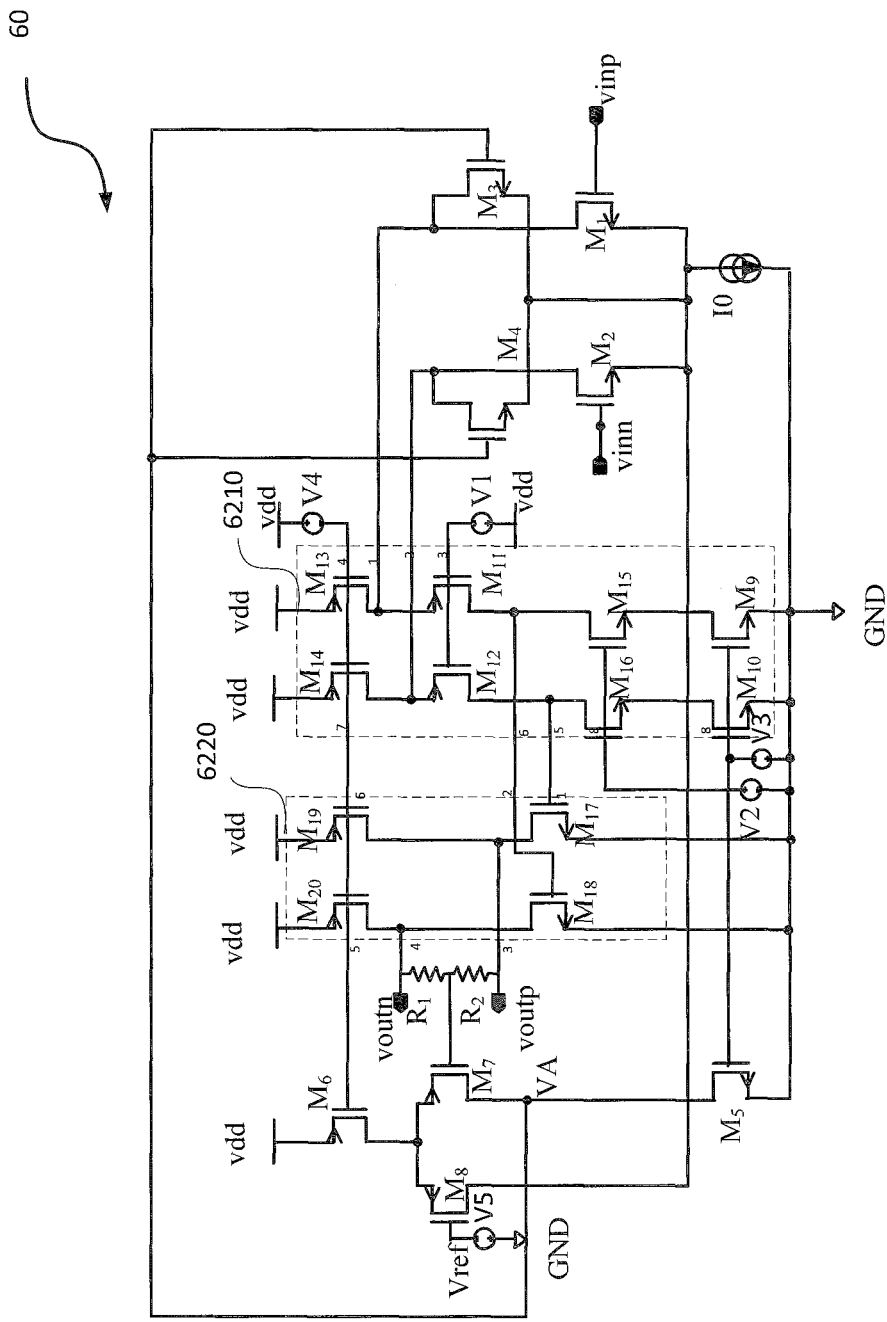
FIG. 6 is a diagram illustrating another specific implementation of the operational amplifier shown in FIG. 2.

FIG. 6 is a diagram illustrating another specific implementation of the operational amplifier shown in FIG. 2. FIG. 6 has many elements similar to that in FIG. 5. Therefore details are omitted for elements already described with respect to FIG. 5. In FIG. 6, the first amplification stage 6210 further comprises a fifteenth MOS transistor $M_{15}$ and a sixteenth MOS transistor $M_{16}$. The ninth MOS transistor $M_9$ is connected to the eleventh MOS transistor $M_{11}$ via the fifteenth MOS transistor $M_{15}$, and the tenth MOS transistor $M_{10}$ is connected to the twelfth MOS transistor $M_{12}$ via the sixteenth MOS transistor $M_{16}$.

First node of the fifteenth MOS transistor M15 is connected to third node of the ninth MOS transistor M9. First node of the sixteenth MOS transistor M16 is connected to the third node of the tenth MOS transistor M10. Second nodes of both the fifteenth MOS transistor M15 and the sixteenth MOS transistor M16 are connected to the second voltage source V2, and V2 is connected to a first power supply. A third node of the fifteenth MOS transistor M15 is connected to the third node of the eleventh MOS transistor M11. A third node of the sixteenth MOS transistor M16 is connected to the third node of the twelfth MOS transistor M12.

The fifteenth MOS transistor M15 and the sixteenth MOS transistor M16 comprise NMOS transistors. The first node of each of the fifteenth and sixteenth MOS transistors M15 and M16 comprises a source. The second node of each of the fifteenth and sixteenth MOS transistors M15 and M16 comprises a gate. The third node of each of the fifteenth and sixteenth MOS transistors M15 and M16 comprises a drain.

Figure 7:
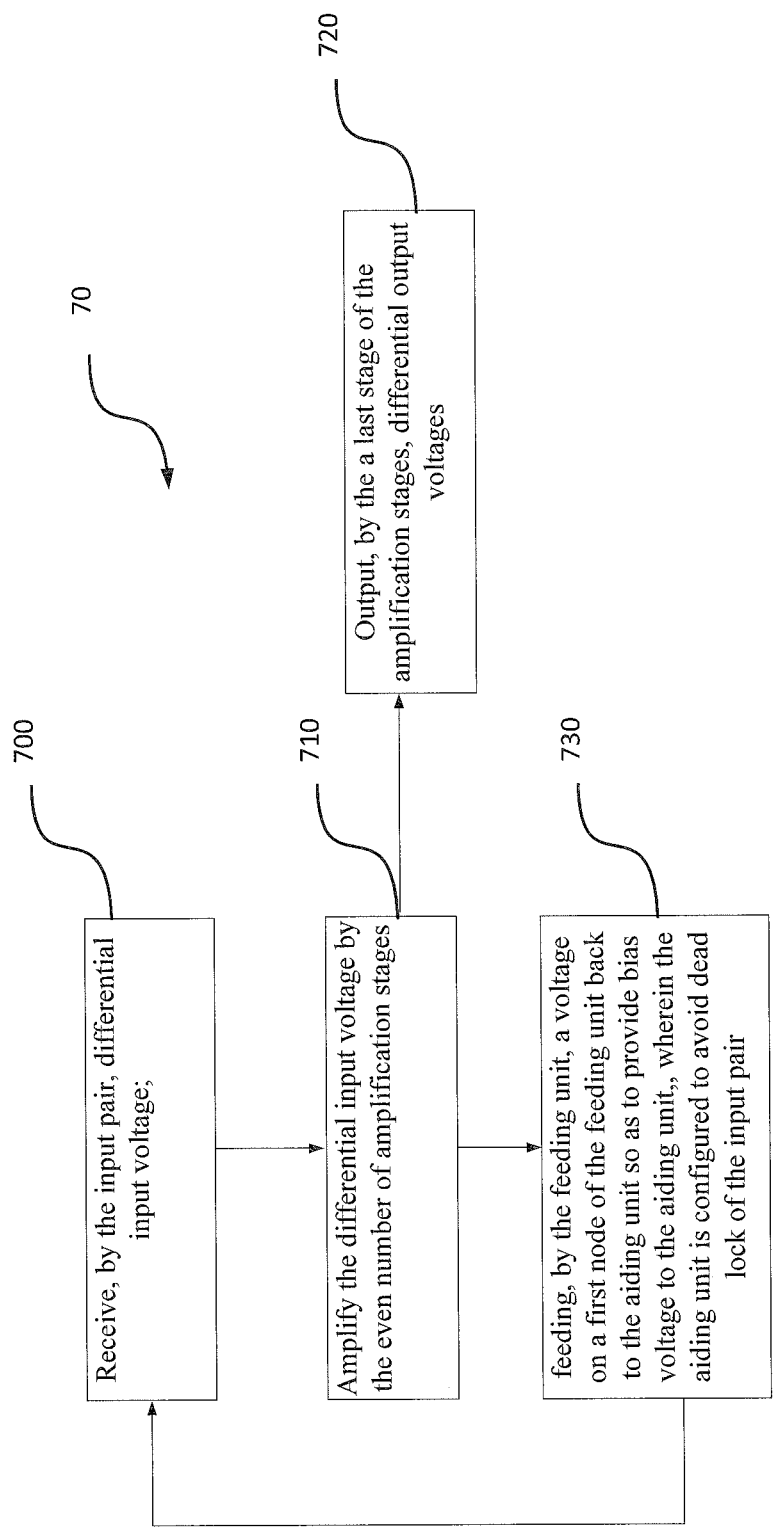
FIG. 7 is a flow chart of a method of amplifying in the operational amplifier.

FIG. 7 is a flow chart of a method 70 of amplifying in the operational amplifier. The method 70 can be implemented in an operational amplifier, for example, the operational amplifier 10 shown in FIG. 1.

First nodes of both the input pair 100 and the aiding unit 110 are connected to the first current source 140. Third nodes of both the input pair 100 and the aiding unit 110 are connected to a first stage of the even number of amplification stages 120. The even number of amplification stages 120 are connected in series. The feeding unit 130 is configured to receive a common mode voltage of the differential output voltages.

The method 70 comprises receiving (in block 700), by the input pair 100, differential input voltage; amplifying (in block 710) the differential input voltage by the even number of amplification stages; outputting (in block 720), by a last stage of the amplification stages, differential output voltages; feeding (in block 730), by the feeding unit, a voltage on a first node of the feeding unit back to the aiding unit so as to provide bias voltage to the aiding unit, wherein the aiding unit is configured to avoid dead lock of the input pair.

Figure 8:
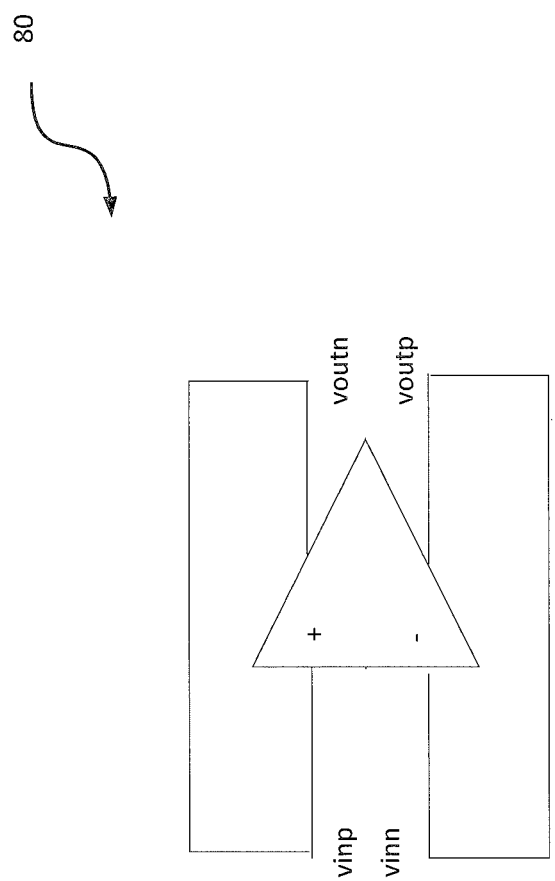
FIG. 8 is a diagram illustrating the connection relationship of an operational amplifier.

FIG. 8 is a diagram illustrating the connection relationship of an operational amplifier 80. The positive input port (vinp) of the operational amplifier 80 is connected to the negative output port (voutn) of the operational amplifier 80, and the negative input port (vinn) of the operational amplifier 80 is connected to the positive output port (voutp) of the operational amplifier 80.

During operation, suppose the operational amplifier works in buffer mode, that means vinp=vinn, and outputs of the operational amplifier are fed back to input port of the operational amplifier, that means vinp=vinn=voutp=voutn, which is shown in FIG. 8. In some circumstances, it may happen that voutp=voutn=vdd, therefore vinp=vinn=vdd. Then the common mode feedback circuit can avoid the deadlock on vdd, which is discussed below.

With embodiments of the invention, for example, the embodiment shown in FIG. 2, when vinp=vinn=vdd, the first PMOS transistor $M_1$ and the second PMOS transistor $M_2$ are off. As the gates of PMOS transistors $M_3$ and $M_4$ are configured to receive voltage VA, the voltage VA is considered. VA is the voltage of the drain of the fifth PMOS transistor $M_5$. As voutp=voutn=vdd which is higher than vref, most of the current through the NMOS $M_6$ passes through NMOS transistor $M_7$ instead of the NMOS transistor $M_8$, that is $I_7 > I_8$. Vref is the reference voltage, which can be provided by the fifth voltage source V5. As $I_6 = I_7 + I_8$, and $I_5 = I_7$, therefore $I_6 > I_5$ and the voltage VA decreases and is lower than Vdd. Therefore the PMOS transistors $M_3$ and M4 are on. $I_5$ represents the current passing through the MOS transistor $M_5$, $I_6$ represents the current passing through the MOS transistor $M_6$, $I_7$ represents the current passing through the MOS transistor $M_7$, $I_8$ represents the current passing through the MOS transistor $M_8$.

As the first current source I0 is fed to both the input pair including the PMOS transistor pair $M_1$ and $M_2$, and the aiding unit including the PMOS transistor pair M3 and M4, and $M_3$ and $M_4$ are on, the current I0 from the first current source can pass through the PMOS transistor pair $M_3$ and $M_4$, and the deadlock can be solved.

On the other hand, during normal operation, that is, the first and second PMOS transistors $M_1$ and $M_2$ work at common mode with Vinn=Vinp=Vref<vdd. Vref may be at a desirable operating voltage. Further the operational amplifier 20 operates to amplify, and works under common mode balance, that means Vinn=Vinp=Vref. The fifth MOS transistor $M_5$ is on. Voutp=Voutn=Vref. $I_5 > I_7 = I_8 = \frac{1}{2}I_6$. When the voltage of VA is relatively low, the fifth MOS transistor M5 is saturated, and its current is larger than $\frac{1}{2}I_6$, therefore VA rises, which forces M5 to linear region, and $I_5$ decreases until $I_5 = \frac{1}{2}I_6$. Therefore VA approximately equals Vdd, that is, VA≈Vdd. Therefore the PMOS transistors $M_3$ and $M_4$ are off, and only the input pair $M_1$ and $M_2$ work, so as not to influence the normal operational of the PMOS transistors $M_1$ and $M_2$.

In some embodiments, the aiding unit 210 does not need additional biasing voltage, and it uses an inherent voltage point in the operational amplifier itself, therefore the operational amplifier can save power. Further, the aiding unit 210 will not cause additional noises. The aiding unit will not bypass current, which can guarantee the transconductance of the input pair. Since when VA rises to be approximate to vdd, the third MOS transistor $M_3$ and the fourth MOS transistor $M_4$ are cut off, and no current passes through these transistors. Further, if the sizes of the devices are fixed, transconductance is proportional to current. The larger the current, the larger the transconductance. When the third MOS transistor $M_3$ and the fourth MOS transistor $M_4$ are cut off, and no current passes through these transistors, the current passing through the input pair will not change, therefore the transconductance of the input pair maintains.

Although the present invention has been described with reference to specific exemplary embodiments, the present invention is not limited to the embodiments described herein, and it can be implemented in form of modifications or alterations without deviating from the spirit and scope of the appended claims. Accordingly, the description and the drawings are to be regarded in an illustrative rather than a restrictive sense.

From the foregoing, it will be appreciated that specific embodiments of the technology have been described herein for purposes of illustration, however various modifications can be made without deviating from the spirit and scope of the present invention. Accordingly, the present invention is not restricted except in the spirit of the appended claims.

Other variations to the disclosed embodiments can be understood and effected by those skilled in the art in practicing the claimed invention, from a study of the drawings, the disclosure, and the appended claims. In the claims the word "comprising" does not exclude other elements or steps, and the indefinite article "a" or "an" does not exclude a plurality. Even if particular features are recited in different dependent claims, the present invention also relates to the embodiments including all these features. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

What is claimed is:

1. An operational amplifier comprising:
   an input pair, an aiding unit, an even number of amplification stages, a feeding unit, a first current source, a second current source; wherein
   both the input pair and the aiding unit are connected to the first current source, the input pair is also configured to receive differential input voltage, and both the input pair and the aiding unit are further connected to a first stage of the even number of amplification stages;
   the even number of amplification stages are connected in series, and a last stage of the amplification stages is configured to output differential output voltages;
   the feeding unit is configured to receive a common mode voltage of the differential output voltages from the last stage, and is configured to feed a voltage on a first node of the feeding unit back to the aiding unit so as to provide bias voltage to the aiding unit, wherein the aiding unit is configured to avoid dead lock of the input pair.

2. The operational amplifier of claim 1, wherein the common mode voltage of the differential output voltages comprises a median voltage potential between the differential output voltages.

3. The operational amplifier of claim 1, wherein the input pair comprises a first MOS transistor and a second MOS transistor, the aiding unit comprises a third MOS transistor and a fourth MOS transistor, the second current source comprises a fifth MOS transistor, the feeding unit comprises a seventh MOS transistor and an eight MOS transistor, the even number of amplification stages comprises a first amplification stage and a second amplification stage, the operational amplifier further comprises a sixth MOS transistor;

wherein first nodes of both the first MOS transistor and the second MOS transistor are connected to the first current source, second node of the first MOS transistor is configured to receive a positive input voltage, and a second node of the second MOS transistor is configured to receive a negative input voltage, a third node of the first MOS transistor is connected to a third node of the third MOS transistor, a third node of the second MOS transistor is connected to a third node of the fourth MOS transistor;

first nodes of both the third MOS transistor and the fourth MOS transistor are connected to the first current source, second nodes of both the third MOS transistor and the fourth MOS transistor are connected to a third node of the seventh MOS transistor, the third node of the third MOS transistor is also connected to a first port of the first amplification stage, the third node of the fourth MOS transistor is also connected to a second port of the first amplification stage;

a first node of the fifth MOS transistor is connected to a first power supply, a second node of the fifth MOS transistor is connected to a third port of the first amplification stage, a third node of the fifth MOS transistor is connected to a third node of the seventh MOS transistor;

a first node of the seventh MOS transistor is connected to both a first node of the eighth MOS transistor and a third node of the sixth MOS transistor, a second node of the seventh MOS transistor is connected to a connection point of the first resistor and the second resistor, a second node of the eighth MOS transistor is connected to a fifth voltage source, a third node of the eighth MOS transistor is connected to the first nodes of the first and the second MOS transistors.

4. The operational amplifier of claim 3, wherein

A third port of the first amplification stage is connected to a third voltage source, fourth and seventh ports of the first amplification stage are connected to a fourth voltage source, a fifth port of the first amplification stage is connected to a first port of the second amplification stage, a sixth port of the first amplification stage is connected to a second port of the second amplification stage, an eighth port of the first amplification stage is connected to a first voltage source, a third port of the second amplification stage is configured to output a positive output voltage, a third a fourth port of the second amplification stage is configured to output a negative output voltage, wherein a first resistor and a second resistor are connected in serial between a positive output voltage port and a negative output voltage port.

5. The operational amplifier of claim 4, wherein the first amplification stage comprises a ninth MOS transistor, a tenth MOS transistor, an eleventh MOS transistor, a twelfth MOS transistor, a thirteenth MOS transistor, a fourteenth MOS transistor, wherein the first port of the first amplification stage comprises a first node of the eleventh MOS transistor, the second port of the first amplification stage comprises a first node of the twelfth MOS transistor, the third port of the first amplification stage comprises a second node of the tenth MOS transistor, the fourth port of the first amplification stage comprises a second node of the thirteenth MOS transistor, the fifth port of the first amplification stage comprises a third node of the twelfth MOS transistor, the sixth port of the first amplification stage comprises a third node of the eleventh MOS transistor, the seventh port of the first amplification stage comprises a second node of the fourteenth MOS transistor;

the eighth port of the first amplification stage comprises a second node of the eleventh MOS transistor;

wherein first nodes of both the ninth and tenth MOS transistors are connected to the first power supply, second nodes of both the ninth and tenth MOS transistors are connected to the second node of the fifth MOS transistor, a third node of the ninth MOS transistor is connected to a third node of the eleventh MOS transistor, a third node of the tenth MOS transistor is connected to a third node of the twelfth MOS transistor;

a first node of the eleventh MOS transistor is connected to a third node of the thirteenth MOS transistor, a first node of the twelfth MOS transistor is connected to a third node of the fourteenth MOS transistor, second nodes of both the eleventh and twelfth MOS transistors are connected to the first voltage source; and both first nodes of the thirteenth MOS transistor and the fourteenth MOS transistor are connected to a second power supply, both second nodes of the thirteenth MOS transistor and the fourteenth MOS transistor are connected to the fourth voltage source.

6. The operational amplifier of claim 5, wherein the first amplification stage further comprises a fifteenth MOS transistor and a sixteenth MOS transistor, wherein the ninth MOS transistor is connected to the eleventh MOS transistor via the fifteenth MOS transistor, and the tenth MOS transistor is connected to the twelfth MOS transistor via the sixteenth MOS transistor;

first node of the fifteenth MOS transistor is connected to third node of the ninth MOS transistor, first node of the sixteenth MOS transistor is connected to the third node of the tenth MOS transistor, second nodes of both the fifteenth MOS transistor and the sixteenth MOS transistor are connected to the second voltage source, a third node of the fifteenth MOS transistor is connected to the third node of the eleventh MOS transistor, a third node of the sixteenth MOS transistor is connected to the third node of the twelfth MOS transistor.

7. The operational amplifier of claim 5, wherein the second amplification stage comprises a seventeenth MOS transistor, an eighteenth MOS transistor, a nineteenth MOS transistor, a twentieth MOS transistor, wherein the first port of the second amplification stage comprises a second node of the seventeenth MOS transistor, the second port of the second amplification stage comprises a second node of the eighteenth MOS transistor, the third port of the second amplification stage comprises a third node of the seventeenth MOS transistor, the fourth port of the second amplification stage comprises a third node of the eighteenth MOS transistor, the fifth port of the second amplification stage comprises a second node of the twentieth MOS transistor, the sixth port of the second amplification stage comprises a second node of the nineteenth MOS transistor;

wherein first nodes of both the seventeenth and eighteenth MOS transistors are connected to the first power supply, a second node of the seventeenth MOS transistor is connected to the third node of the twelfth MOS transistor, a second node of the eighteenth MOS transistor is connected to the third node of the eleventh MOS transistor, a third node of the seventeenth MOS transistor is connected to a third node of the nineteenth MOS transistor, a third node of the eighteenth MOS transistor is connected to a third node of the twentieth MOS transistor;

first nodes of both the nineteenth MOS transistor and the twentieth MOS transistor are connected to a second power supply, second nodes of both the nineteenth and twentieth MOS transistors are connected to the fourth voltage source.

8. The operational amplifier of claim 7, wherein the first, the second, the third, the fourth MOS transistors, the fifth MOS transistor, the ninth MOS transistor, the tenth MOS transistor, the seventeenth MOS transistor and the eighteenth MOS transistor include PMOS transistors, the sixth MOS transistor, the seventh MOS transistor, the eighth MOS transistor, the eleventh MOS transistor, the twelfth MOS transistor, the thirteenth MOS transistor, the fourteenth MOS transistor, the nineteenth MOS transistor and the twentieth MOS transistor include NMOS transistors, the first power supply comprises a positive power supply and the second power supply comprises ground; and the first node of each of these MOS transistors comprises a source, the second node of each of these MOS transistors comprises a gate, and the third node of each of these MOS transistors comprises a drain.

9. The operational amplifier of claim 8, wherein the first amplification stage further comprises a fifteenth MOS transistor and a sixteenth MOS transistor, wherein the ninth MOS transistor is connected to the eleventh MOS transistor via the fifteenth MOS transistor, and the tenth MOS transistor is connected to the twelfth MOS transistor via the sixteenth MOS transistor;

first node of the fifteenth MOS transistor is connected to third node of the ninth MOS transistor, second node of the sixteenth MOS transistor is connected to the third node of the tenth MOS transistor, second nodes of both the fifteenth MOS transistor and the sixteenth MOS transistor are connected to the second voltage source, a third node of the fifteenth MOS transistor is connected to the third node of the eleventh MOS transistor, a third node of the sixteenth MOS transistor is connected to the third node of the twelfth MOS transistor; and the fifteenth MOS transistor and the sixteenth MOS transistor comprise PMOS transistors, and the first node of each of the fifteenth and sixteenth MOS transistors comprises a source, the second node of each of the fifteenth and sixteenth MOS transistors comprises a gate, and the third node of each of the fifteenth and sixteenth MOS transistors comprises a drain.

10. The operational amplifier of claim 7, wherein the first, the second, the third, the fourth MOS transistors, the fifth MOS transistor, the ninth MOS transistor, the tenth MOS transistor, the seventeenth MOS transistor, the eighteenth MOS transistor include NMOS transistors, the sixth MOS transistor, the seventh MOS transistor, the eighth MOS transistor, the eleventh MOS transistor, the twelfth MOS transistor, the thirteenth MOS transistor, the fourteenth MOS transistor, the nineteenth MOS transistor and the twentieth MOS transistor include PMOS transistors, the first power supply comprises ground supply and the second power supply comprises a positive power; and the first node of each of these MOS transistors comprises a source, the second node of each of these MOS transistors comprises a gate, and the third node of each of these MOS transistors comprises a drain.

11. The operational amplifier of claim 10, wherein the first amplification stage further comprises a fifteenth MOS transistor and a sixteenth MOS transistor, wherein the ninth MOS transistor is connected to the eleventh MOS transistor via the fifteenth MOS transistor, and the tenth MOS transistor is connected to the twelfth MOS transistor via the sixteenth MOS transistor;

first node of the fifteenth MOS transistor is connected to third node of the ninth MOS transistor, first node of the sixteenth MOS transistor is connected to the third node of the tenth MOS transistor, second nodes of both the fifteenth MOS transistor and the sixteenth MOS transistor are connected to the second voltage source, a third node of the fifteenth MOS transistor is connected to the third node of the eleventh MOS transistor, a third node of the sixteenth MOS transistor is connected to the third node of the twelfth MOS transistor; and the fifteenth MOS transistor and the sixteenth MOS transistor comprise NMOS transistors, and the first node of each of the fifteenth and sixteenth MOS transistors comprises a source, the second node of each of the fifteenth and sixteenth MOS transistors comprises a gate, and the third node of each of the fifteenth and sixteenth MOS transistors comprises a drain.

12. A method in an operational amplifier, wherein the operational amplifier comprises:

an input pair, an aiding unit, an even number of amplification stages, a feeding unit, a first current source, a second current source; wherein first nodes of both the input pair and the aiding unit are connected to the first current source, and third nodes of both the input pair and the aiding unit are connected to a first stage of the even number of amplification stages;

the even number of amplification stages are connected in series;

the feeding unit is configured to receive a common mode voltage of the differential output voltages from a last stage of the amplification stages;

where the method comprises receiving, by the input pair, differential input voltage;

amplifying the differential input voltage by the even number of amplification stages;

outputting, by a last stage of the amplification stages, differential output voltages;

feeding, by the feeding unit, a voltage on a first node of the feeding unit back to the aiding unit so as to provide bias voltage to the aiding unit, wherein the aiding unit is configured to avoid dead lock of the input pair.

13. The method of claim 12, wherein the common mode voltage of the differential output voltages has a median value between the differential output voltages.

14. The method of claim 12, wherein the input pair comprises a first MOS transistor and a second MOS transistor, the aiding unit comprises a third MOS transistor and a fourth MOS transistor, the second current source comprises a fifth MOS transistor, the feeding unit comprises a seventh MOS transistor and an eight MOS transistor, the even number of amplification stages comprises a first amplification stage and a second amplification stage, the operational amplifier further comprises a sixth MOS transistor;

wherein first nodes of both the first MOS transistor and the second MOS transistor are connected to the first current source, second nodes of the first MOS transistor and a second node of the second MOS transistor are respectively configured to receive a positive input voltage and a negative input voltage, a third node of the first MOS transistor is connected to a third node of the third MOS transistor, a third node of the second MOS transistor is connected to a third node of the fourth MOS transistor;

first nodes of both the third MOS transistor and the fourth MOS transistor are connected to the first current source, second nodes of both the third MOS transistor and the fourth MOS transistor are connected to a third node of the seventh MOS transistor, the third node of the third MOS transistor is also connected to a first port of the first amplification stage, the third node of the fourth MOS transistor is also connected to a second port of the first amplification stage;

a first node of the fifth MOS transistor is connected to a first power supply, a second node of the fifth MOS transistor is connected to the third port of the first amplification stage, a third node of the fifth MOS transistor is connected to a third node of the seventh MOS transistor;

a first node of the seventh MOS transistor is connected to both a first node of the eighth MOS transistor and a third node of the sixth MOS transistor, a second node of the seventh MOS transistor is connected to a connection point of the first resistor and the second resistor, a second node of the eighth MOS transistor is connected to a fifth voltage source, a third node of the eighth MOS transistor is connected to the first nodes of the first and the second MOS transistors.

15. The method of claim 14, wherein
a third port of the first amplification stage is connected to a third voltage source, fourth and seventh ports of the first amplification stage are connected to a fourth voltage source, a fifth port of the first amplification stage is connected to a first port of the second amplification stage, a sixth port of the first amplification stage is connected to a second port of the second amplification stage, an eighth port of the first amplification stage is connected to a first voltage source, a third port of the second amplification stage is configured to output a positive output voltage, a third a fourth port of the second amplification stage is configured to output a negative output voltage, wherein a first resistor and a second resistor are connected in serial between a positive output voltage port and a negative output voltage port.

16. The method of claim 15, wherein
the first amplification stage comprises a ninth MOS transistor, a tenth MOS transistor, an eleventh MOS transistor, a twelfth MOS transistor, a thirteenth MOS transistor, a fourteenth MOS transistor, wherein the first port of the first amplification stage comprises a first node of the eleventh MOS transistor, the second port of the first amplification stage comprises a first node of the twelfth MOS transistor, the third port of the first amplification stage comprises a second node of the tenth MOS transistor, the fourth port of the first amplification stage comprises a second node of the thirteenth MOS transistor, the fifth port of the first amplification stage comprises a third node of the twelfth MOS transistor, the sixth port of the first amplification stage comprises a third node of the eleventh MOS transistor, the seventh port of the first amplification stage comprises a second node of the fourteenth MOS transistor; the eighth port of the first amplification stage comprises a second node of the eleventh MOS transistor;

wherein first nodes of both the ninth and tenth MOS transistors are connected to the first power supply, second nodes of both the ninth and tenth MOS transistors are connected to the second node of the fifth MOS transistor, a third node of the ninth MOS transistor is connected to a third node of the eleventh MOS transistor, a third node of the tenth MOS transistor is connected to a third node of the twelfth MOS transistor;

a first node of the eleventh MOS transistor is connected to a third node of the thirteenth MOS transistor, a first node of the twelfth MOS transistor is connected to a third node of the fourteenth MOS transistor, second nodes of both the eleventh and twelfth MOS transistors are connected to the first voltage source; and both first nodes of the thirteenth MOS transistor and the fourteenth MOS transistor are connected to a second power supply, both second nodes of the thirteenth MOS transistor and the fourteenth MOS transistor are connected to the fourth voltage source.

17. The method of claim 16 wherein
the first amplification stage further comprises a fifteenth MOS transistor and a sixteenth MOS transistor, wherein the ninth MOS transistor is connected to the eleventh MOS transistor via the fifteenth MOS transistor, and the tenth MOS transistor is connected to the twelfth MOS transistor via the sixteenth MOS transistor;

first node of the fifteenth MOS transistor is connected to third node of the ninth MOS transistor, first node of the sixteenth MOS transistor is connected to the third node of the tenth MOS transistor, second nodes of both the fifteenth MOS transistor and the sixteenth MOS transistor are connected to the second voltage source, a third node of the fifteenth MOS transistor is connected to the third node of the eleventh MOS transistor, a third node of the sixteenth MOS transistor is connected to the third node of the twelfth MOS transistor.

18. The method of claim 16, wherein
the second amplification stage comprises a seventeenth MOS transistor, an eighteenth MOS transistor, a nineteenth MOS transistor, a twentieth MOS transistor, wherein the first port of the second amplification stage comprises a second node of the seventeenth MOS transistor, the second port of the second amplification stage comprises a second node of the eighteenth MOS transistor, the third port of the second amplification stage comprises a third node of the seventeenth MOS transistor, the fourth port of the second amplification stage comprises a third node of the eighteenth MOS transistor, the fifth port of the second amplification stage comprises a second node of the twentieth MOS transistor, the sixth port of the second amplification stage comprises a second node of the nineteenth MOS transistor;

wherein first nodes of both the seventeenth and eighteenth MOS transistors are connected to the first power supply, a second node of the seventeenth MOS transistor is connected to the third node of the twelfth MOS transistor, a second node of the eighteenth MOS transistor is connected to the third node of the eleventh MOS transistor, a third node of the seventeenth MOS transistor is connected to a third node of the nineteenth MOS transistor, a third node of the eighteenth MOS transistor is connected to a third node of the twentieth MOS transistor;

first nodes of both the nineteenth MOS transistor and the twentieth MOS transistor are connected to a second power supply, second nodes of both the nineteenth and twentieth MOS transistors are connected to the fourth voltage source.

19. The method of claim 18, wherein the first, the second, the third, the fourth MOS transistors, the fifth MOS transistor, the ninth MOS transistor, the tenth MOS transistor, the seventeenth MOS transistor and the eighteenth MOS transistor include PMOS transistors, the sixth MOS transistor, the seventh MOS transistor, the eighth MOS transistor, the eleventh MOS transistor, the twelfth MOS transistor, the thirteenth MOS transistor, the fourteenth MOS transistor, the nineteenth MOS transistor and the twentieth MOS transistor include NMOS transistors, the first power supply comprises a positive power supply and the second power supply comprises ground; and the first node of each of these MOS transistors comprises a source, the second node of each of these MOS transistors comprises a gate, and the third node of each of these MOS transistors comprises a drain.

20. The method of claim 19, wherein the first amplification stage further comprises a fifteenth MOS transistor and a sixteenth MOS transistor, wherein the ninth MOS transistor is connected to the eleventh MOS transistor via the fifteenth MOS transistor, and the tenth MOS transistor is connected to the twelfth MOS transistor via the sixteenth MOS transistor;

first node of the fifteenth MOS transistor is connected to third node of the ninth MOS transistor, second node of the sixteenth MOS transistor is connected to the third node of the tenth MOS transistor, second nodes of both the fifteenth MOS transistor and the sixteenth MOS transistor are connected to the second voltage source, a third node of the fifteenth MOS transistor is connected to the third node of the eleventh MOS transistor, a third node of the sixteenth MOS transistor is connected to the third node of the twelfth MOS transistor; and the fifteenth MOS transistor and the sixteenth MOS transistor comprise PMOS transistors, and the first node of each of the fifteenth and sixteenth MOS transistors comprises a source, the second node of each of the fifteenth and sixteenth MOS transistors comprises a gate, and the third node of each of the fifteenth and sixteenth MOS transistors comprises a drain.

21. The method of claim 18, wherein the first, the second, the third, the fourth MOS transistors, the fifth MOS transistor, the ninth MOS transistor, the tenth MOS transistor, the seventeenth MOS transistor, the eighteenth MOS transistor include NMOS transistors, the sixth MOS transistor, the seventh MOS transistor, the eighth MOS transistor, the eleventh MOS transistor, the twelfth MOS transistor, the thirteenth MOS transistor, the fourteenth MOS transistor, the nineteenth MOS transistor and the twentieth MOS transistor include PMOS transistors, the first power supply comprises ground supply and the second power supply comprises a positive power; and the first node of each of these MOS transistors comprises a source, the second node of each of these MOS transistors comprises a gate, and the third node of each of these MOS transistors comprises a drain.

22. The method of claim 21, wherein the first amplification stage further comprises a fifteenth MOS transistor and a sixteenth MOS transistor, wherein the ninth MOS transistor is connected to the eleventh MOS transistor via the fifteenth MOS transistor, and the tenth MOS transistor is connected to the twelfth MOS transistor via the sixteenth MOS transistor;

first node of the fifteenth MOS transistor is connected to third node of the ninth MOS transistor, first node of the sixteenth MOS transistor is connected to the third node of the tenth MOS transistor, second nodes of both the fifteenth MOS transistor and the sixteenth MOS transistor are connected to the second voltage source, a third node of the fifteenth MOS transistor is connected to the third node of the eleventh MOS transistor, a third node of the sixteenth MOS transistor is connected to the third node of the twelfth MOS transistor; and the fifteenth MOS transistor and the sixteenth MOS transistor comprise NMOS transistors, and the first node of each of the fifteenth and sixteenth MOS transistors comprises a source, the second node of each of the fifteenth and sixteenth MOS transistors comprises a gate, and the third node of each of the fifteenth and sixteenth MOS transistors comprises a drain.

\* \* \* \* \*